United States Patent

Jeon

[11] Patent Number: 5,818,305
[45] Date of Patent: Oct. 6, 1998

[54] AUTOMATIC SUBSTITUTION OF A REFERENCE OSCILLATOR FOR SYNCHRONIZING TWO TRANSMITTER CO-CHANNEL LOCAL OSCILLATORS

[75] Inventor: Seong-Min Jeon, Seoul, Rep. of Korea

[73] Assignee: Samsung Electronics Co., Ltd., Suwon, Rep. of Korea

[21] Appl. No.: 688,371

[22] Filed: Jul. 30, 1996

[30] Foreign Application Priority Data

Aug. 24, 1995 [KR] Rep. of Korea .................. 1995/26430

[51] Int. Cl.[6] ..................................................... H03L 7/07
[52] U.S. Cl. ................................. 331/47; 331/2; 331/49; 375/260; 455/60
[58] Field of Search ................................ 331/18, 47, 49, 331/2; 375/260; 455/60

[56] References Cited

U.S. PATENT DOCUMENTS 4,254,492 3/1981 McDermott, III ......................... 331/49
4,419,629 12/1983 O'Brien ..................................... 331/49

Primary Examiner—Siegfried H. Grimm
Attorney, Agent, or Firm—Dilworth & Barrese

[57] ABSTRACT

A circuit for automatically substituting a reference oscillator for synchronizing two transmitter co-channel local oscillators. The circuit includes a first bias switching device for switching a first power supply to a first reference oscillator and a second bias switching device for switching a second power supply to a second reference oscillator. The first and second reference oscillators generate first and second reference signals for synchronizing the oscillator frequencies. A first divider firstly and secondly divides and outputs the power of the first reference signal. A second divider firstly and secondly divides and outputs the power of the second reference signal. A first combining device inputs the power of the firstly-divided first reference signal and the secondly-divided second reference signal and outputs the power to the phase locked dielectric resonator oscillator for the vertical polarization wave. A second combining device inputs the power of the firstly-divided second reference signal and the secondly-divided first reference signal and outputs the power to the phase locked dielectric resonator oscillator for the horizontal polarization wave. A first switching control switches the second bias switching device in response to generation of the first reference signal secondly-divided in the first divider. A second switching control switches the first bias switching device in response to generation of the second reference signal secondly-divided in the second divider.

11 Claims, 3 Drawing Sheets

AUTOMATIC SUBSTITUTION OF A REFERENCE OSCILLATOR FOR SYNCHRONIZING TWO TRANSMITTER CO-CHANNEL LOCAL OSCILLATORS

BACKGROUND OF THE INVENTION

1. Field of the Invention

The present invention relates to a digital microwave system and, more particularly, to a circuit for synchronizing a frequency of a transmitter local oscillator in a digital microwave system for use in a co-channel.

The present application for a circuit for synchronizing a frequency of a transmitter local oscillator in a digital microwave system for use in a co-channel is based on Korean Application No. 26430/1995, which is incorporated herein by reference for all purposes.

2. Description of the Related Art

Recently, most of digital microwave systems generally use a co-channel to increase the efficiency of the channel. The digital microwave systems divide a frequency corresponding to one channel into a vertical polarization wave (hereinafter, referred to as "V") mode and into a horizontal polarization wave (hereinafter, referred to as "H") mode, and then provide data to the divided respective modes. In an opposite channel to the one channel, the digital microwave systems can perform an operation opposite to the above operation.

In a point-to-point microwave system which is operated with the co-channel, upon transmission, a baseband signal is modulated as an intermediate frequency signal by a modulation method which is adapted in the above system. Thereafter, in the aforesaid system, a phase locked dielectric resonator oscillator (hereinafter, referred to as "PLDRO") which has an excellent frequency stability and a phase noise feature, respectively, in the V mode and the H mode, is used as a local oscillator and thus the frequency is raised in a frequency converter. After power amplification, V and H signals having the raised frequency are united in a unitary format and transmitted in an orthomode transducer (hereinafter, referred to as OMT).

In the digital microwave system, upon reception, the frequency of the transmitter local oscillator in the V mode should be synchronized to be equal to that of the transmitter local oscillator in the H mode, on the purpose of minimizing an error in a demodulated signal.

The PLDRO used as the transmitter local oscillator may have an external construction wherein a phase thereof is fixed by an external fixed density reference oscillator. As a result, upon synchronizing an external reference oscillator signal inputted to the PLDRO for each of the V and H modes, the PLDRO can synchronize an output frequency thereof.

FIG. 1 is a block diagram illustrating a circuit for synchronizing a frequency of a conventional transmitter local oscillator, in which reference numerals 2 and 12, respectively, designate local oscillators as V-type and H-type PLDROs. Herein, circuits for synchronizing the frequency of the transmitter local oscillator designate reference numerals 10 and 20, which generate each of the reference signals for fixing the phases of the V-type and H-type PLDROs 2 and 12. Also, the above circuits 10 and 20 for synchronizing the frequency of the transmitter local oscillator synchronize the reference signals thereof through lines 22 and 24.

An explanation on the construction of the circuits 10 and 20 for synchronizing the frequency of the local oscillator will be in detail given hereinafter. Reference numerals 4 and 14, respectively, designate V-type and H-type reference oscillators where the frequencies of the reference signals output in accordance with each of adjusting voltages are various. Further, reference numerals 6 and 16, respectively, designate V-type and H-type phase comparators and reference numerals 8 and 18, respectively, designate V-type and H-type loop filters.

After phase-compared at the V-type phase comparator 6 with the reference signal output from the H-type reference oscillator 14, the reference signal output from the V-type reference oscillator 4 controls an adjusting voltage of the V-type reference oscillator 4 through the V-type loop filter 8. Therefore, the frequency of the V-type reference oscillator 4 is synchronized with that of the H-type reference oscillator 14.

However, the conventional method as stated above for synchronizing the frequency may be complicated as well as that the malfunction of the system may be caused in the event that either of V-type and H-type reference oscillators is out of order. In addition, in the event that the one of V-type and H-type reference oscillators is out of order, it would be inconvenient to have to switch the other thereof manually by hand, to thereby be operated (that is, connection made with a dotted line 24 as shown in FIG. 1).

SUMMARY OF THE INVENTION

It is therefore an object of the present invention to provide a circuit for reliably synchronizing a frequency of a transmitter local oscillator in a digital microwave system.

It is another object of the present invention to provide a circuit for processing an output signal of either of V-type and H-type reference oscillators and synchronizing a phase locked dielectric resonator oscillator for use in the V-type and the H-type, at the same time.

It is yet another object of the present invention to provide a circuit for removing a reciprocal frequency synchronism between V-type and H-type reference oscillators.

It is still another object of the present invention to provide a circuit for automatically switching the one reference oscillator with the other reference oscillator, in the case that the one reference oscillator under operation is out of order.

These and other objects can be achieved according to the principles of the present invention with a circuit for synchronizing a frequency of a phase locked dielectric resonator oscillator of vertical and horizontal polarization waves in a digital microwave system for use in a co-channel, comprising: a first bias switching unit for switching a first power supply; a second bias switching unit for switching a second power supply; a first reference signal generating unit for generating a first reference signal for synchronism of the local oscillator frequency by the first power supply; a second reference signal generating unit for generating a second reference signal for synchronism of the local oscillator frequency by the second power supply; a first dividing unit for firstly and secondly dividing and outputting power of the first reference signal; a second dividing unit for firstly and secondly dividing and outputting power of the second reference signal; a first combining unit for combining the power of the firstly-divided first reference signal with the secondly-divided second reference signal and outputting the combined power to the phase locked dielectric resonator oscillator for use in the vertical polarization wave; a second combining unit for combining the power of the firstly-divided second reference signal with the secondly-divided first reference signal and outputting the combined power to the phase locked dielectric resonator oscillator for use in the vertical polarization wave; a first switching control unit for switching the second bias switching unit, for purposes of closing the second power in response to generation of the first reference signal secondly-divided in the first dividing unit; and a second switching control unit for switching the first bias switching unit, for purposes of closing the first power in response to generation of the second reference signal secondly-divided in the second dividing unit.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements or components, wherein.

DETAILED DESCRIPTION OF THE PREFERRED EMBODIMENTS

Figure 1:
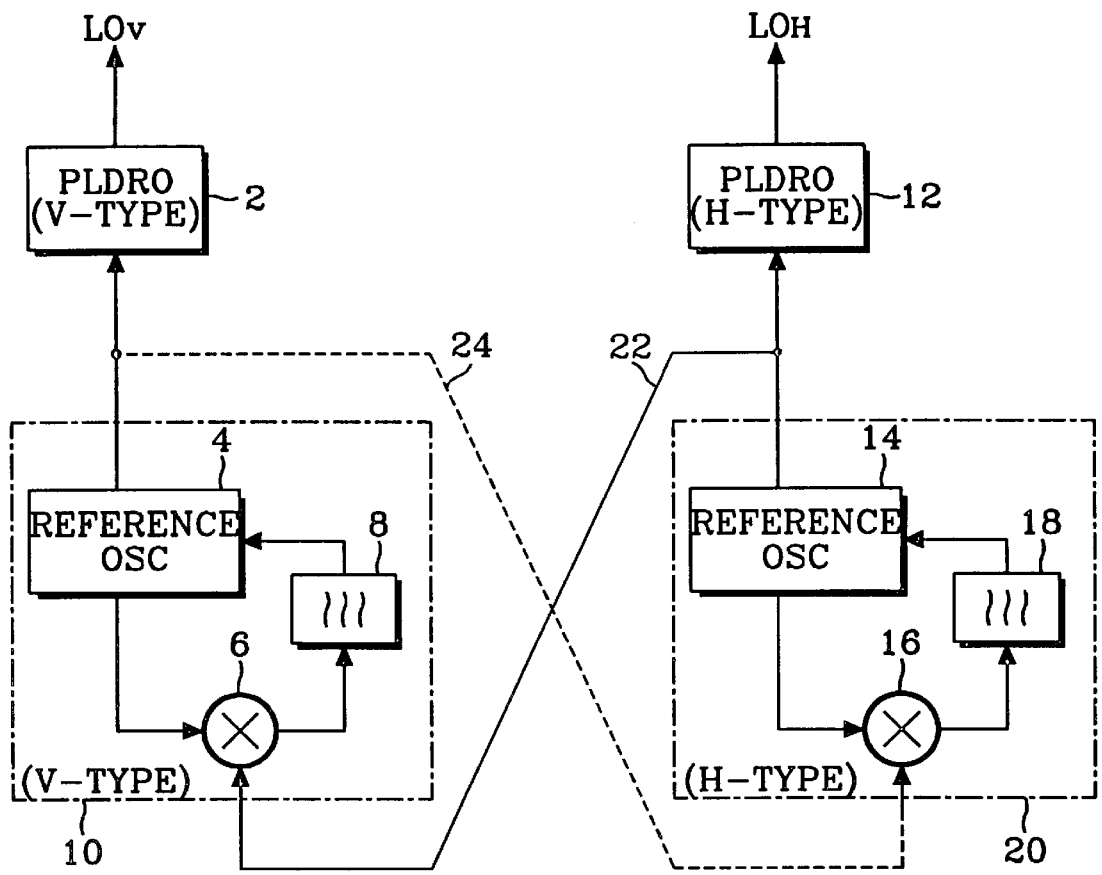
FIG. 1 is a block diagram illustrating a prior art circuit for synchronizing a frequency of a conventional transmitter local oscillator.

It should be noted that like reference numerals are used for like elements or parts even though they are displayed in another drawing.

Figure 2:
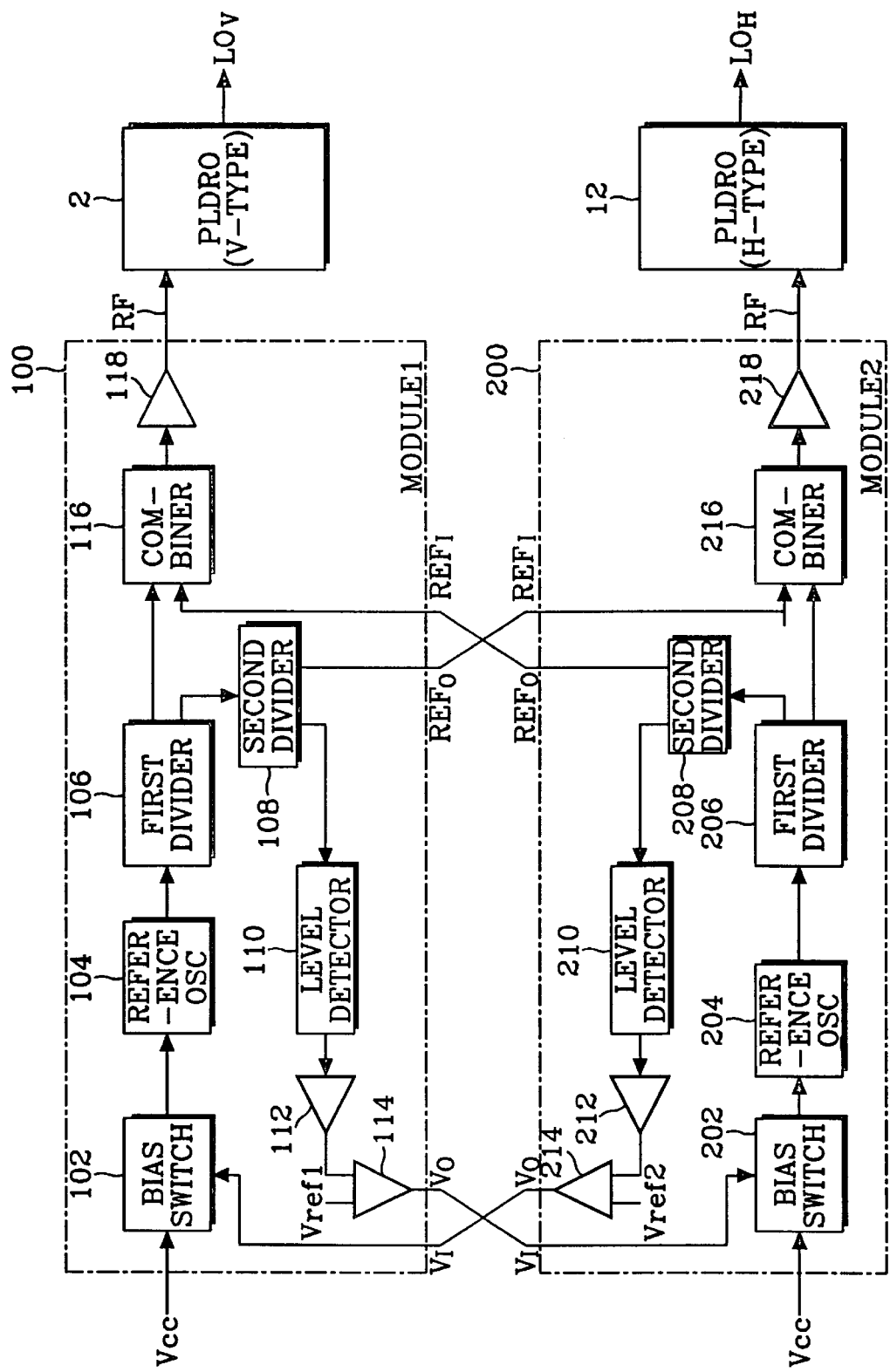
FIG. 2 is a block diagram illustrating a circuit for synchronizing a frequency of a transmitter local oscillator according to the present invention.
Figure 3:
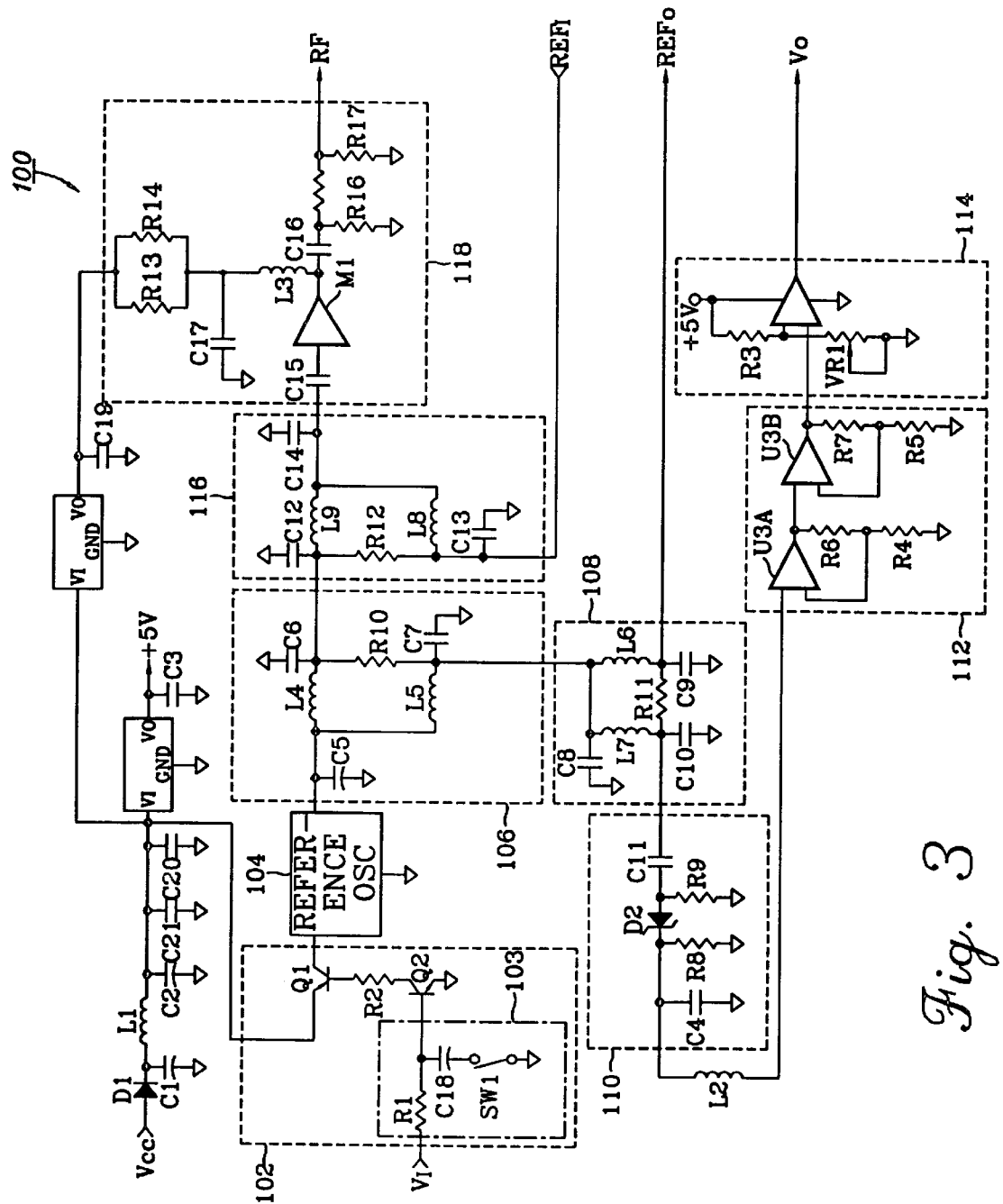
FIG. 3 is a schematic diagram illustrating the circuit for synchronizing the frequency of the transmitter local oscillator of FIG. 2.

FIG. 2 is a block diagram illustrating a circuit for synchronizing a frequency of a transmitter local oscillator according to the present invention. In FIG. 2, a module1 100 designates a circuit for synchronizing a frequency of a V-type transmitter local oscillator and for providing a reference signal RF to a V-type PLDRO 2 and a module2 200 designates a circuit for synchronizing a frequency of an H-type transmitter local oscillator and for providing the reference signal RF to an H-type PLDRO 12. The like elements or parts which have the same name as each other in the module1 100 and the module2 200 perform the same construction and operation as each other therein. FIG. 3 is a schematic diagram illustrating the circuit for synchronizing the frequency of the transmitter local oscillator of FIG. 2.

A characteristic according to the present invention is to apply the reference signal output from either of V-type and H-type reference oscillators, to the V-type and H-type PLDROs 2 and 12, at the same time. For example, when a reference oscillator 104 of the module1 100 is operated to output the reference signal, the reference signal is applied as an equal power value to a combiner 116 of the module1 100 and a combiner 216 of the module2 200, and is eventually applied to the V-type and H-type PLDROs 2 and 12.

Another characteristic according to the present invention, in the event that the one reference oscillator under operation is out of order, is to automatically switch the one reference oscillator with the other reference oscillator and to enable the other reference oscillator to be operated. For instance, if the reference oscillator 104 of the module1 100 is out of order and thus cannot be operated, a bias switch 202 of the other module opposite to one reference oscillator 104, i.e., the module2 200 is switched on by means of a first divider 106, a second divider 108, a level detector 110, a DC amplifier 112 and a comparator 114 of the module1 100. Thus, the power supply VCC is applied to the reference oscillator 204 of the module2 200 by the bias switch 202 and the reference oscillator 204 generates the reference signal.

With reference to FIGS. 2 and 3, reference numerals 102 and 202 designate the bias switches which are turned on/off to pass the power supply VCC to the reference oscillators 104 and 204, each of which comprising transistor Q1. The bias switches 102 and 202 reciprocally switch the power supply VCC applied to the reference oscillator 204 of the opposite module thereto, in accordance with existence/ nonexistence of the normal operation of the reference oscillators 104 and 204. If the bias switch 102 of the module1 110 is switched on, the reference oscillator 104 is normally operated and generates the reference signal RF. Accordingly, the bias switch 202 of the module2 200 is switched off by the first divider 106, the second divider 108, the level detector 110, the DC amplifier 112, and the comparator 114. To the contrary, if the bias switch 102 of the module1 100 is switched off, the reference oscillator 104 is not operated and does not generate the reference signal RF. Thus, the bias switch 202 of the module2 200 is switched on. As a consequence, when an initial power supply VCC is applied, the bias switches 102 and 202, respectively, are comprised of a precedence determining circuit (as shown by 103 of FIG. 3), so that the one module can be operated prior to the other module. Reference numerals 104 and 204 designate the reference oscillators and, when the power supply VCC is applied, generate the reference signal RF. Here, the reference signal RF is used for synchronizing the frequency of the local oscillator of the V-type and H-type PLDROs 2 and 12.

Reference numerals 106 and 206 designate the first dividers. The first dividers 106 and 206 divide the power of the reference signal RF output from the reference oscillators 104 and 204 into the combiner 116 and the second divider 108. The first dividers 106 and 206, preferably an unbalance type Wilkinson divider which is exemplary thereof, divide the power of the signal applied to the combiners 116 and 216 and the power of the signal applied to the second dividers 108 and 208, by a ratio of 2:3. Reference numerals 108 and 208 designate the second dividers. Also, the second dividers 108 and 208, as the unbalance type Wilkinson divider, divide the power of the signal output from the first dividers 106 and 206 into the level detectors 110 and 210 and into the combiners 216 and 116 of the opposite module thereto. At this time, the ratio of dividing the power of the signal divided into the level detectors 110 and 210 and the signal divided into the combiners 216 and 116 is 2:3. Consequently, the power of the signals which are divided by the first dividers 106 and 206 and applied to the combiners 116 and 216, is equal to that of the signal applied by the first dividers 106 and 206 and the second dividers 108 and 208 to the combiners 216 and 116 of the opposite module thereto. The reference numerals 116 and 216 designate a Wilkinson combiner. The combiners 116 and 216 have an input isolation feature for the signal of the second dividers 208 and 108 which are positioned at the opposite module thereto. The outputs of the combiners 116 and 216 are amplified to an adequate level at amplifiers 118 and 218 and then applied as the reference signal RF to the PLDROs 2 and 12.

Reference numerals 110 and 210 designate level detectors, each having a schottky diode. The level detectors 110 and 210 convert the signal output from the second dividers 108 and 208 into the DC voltage and output the converted voltage to the DC amplifiers 112 and 212. Reference numerals 112 and 212 designate the DC amplifiers, each having an Op-Amp. The DC amplifiers 112 and 212 amplify the DC voltage output from the level detectors 110 and 210 at a proper level and then output the amplified voltage to the comparators 114 and 214. Reference numerals 114 and 214 designate the comparators, each having an Op-Amp. The comparators 114 and 214 compare the signal amplified in the DC amplifiers 112 and 212 with each of reference voltages Vref1 and Vref2, and output a logic "H" state or a logic "L" state. In the case that the output voltage of the DC amplifiers 112 and 212 is more than the reference voltages Vref1 and Vref2, the comparators 114 and 214 output the logic "L" state. On the other hand, in the case that the output voltage of the DC amplifiers 112 and 212 is less than the reference voltages Vref1 and Vref2, the comparators 114 and 214 output the logic "H" state. The logic "H" state turns on the bias switches 102 and 202 of the opposite module thereto and the logic "L" state turns off the bias switches 102 and 202 thereof.

As seen from FIGS. 2 and 3, an operation of the present invention will be more concretely explained hereinafter. In the following description of the operation according to the present invention, it is assumed and noted that the reference oscillator 104 of the module1 100 is operated. Therefore, it is noted that the reference oscillator 204 of the module2 200 is not operated.

Now, when applied, the power supply VCC is applied to the reference oscillator 104 by the bias switch 102 of the module1 100. Thus, the reference oscillator 104 to which the power supply VCC is applied is operated, thereby generating the reference signal. The power of the generated reference signal is divided in the first divider 106, which comprises passive components R10, L4, L5, and C5–C7. At this moment, a ratio of the power which is divided into the combiner 116 and the second divider 108, is 2:3. One signal divided in the first divider 106 is output through the combiner 116, which comprises passive components R12, L8, L9 and C12–14, is amplified in the amplifier 118, and is applied to the V-type PLDRO 2. As well, the other signal divided in the first divider 106 is also divided as two signals by the second divider 108, which comprises passive components R11, L6, L7 and C8–10.

One signal from the second divider 108 is connected to an $REF_1$ connector of the module2 200 though an $REF_0$ connector and a RF cable of the module1 100, and then is applied to the combiner 216 of the module2 200. The signal applied to the combiner 216 of the module2 200 is amplified in the amplifier 218 and then is applied to the H-type PLDRO 12. The other signal from the second divider 108 is applied to the level detector 110. Here, the ratio of dividing the power of the signal applied to the combiner 216 of the other module, i.e., the module2 200 and the power of the signal applied to the level detector 110 of the module1 110 is 3:2.

In this instance, the power of the signal applied to the combiner 116 of the module1 100 through the first divider 106 of the module1 100 and the power of the signal applied to the combiner 216 of the module2 200 through the first divider 106 and the second divider 108 of the module1 100 are unequally divided to each other as shown in the above power division ratio of the first and second dividers 106 and 108. Accordingly, the reference signals RF applied to the V-type and H-type PLDRO 2 and 12 are equal to each other.

Meanwhile, the other signal divided in the second divider 108 of the module1 100 is applied to the level detector 110 of the module1 100. The level detector 110 converts the applied signal into a given DC voltage by the schottky diode D2 and outputs the converted signal to the DC amplifier 112. The DC amplifier 112 is comprised of two terminal OP-Amps U3A and U3B. As a result, the DC voltage which is twice amplified in the OP-Amps U3A and U3B is applied to the comparator 114, and thus compared with the reference voltage Vref of the comparator 114. When the reference signal of the oscillator 104 of the module1 100 is more than the reference voltage Vref1, the output of the comparator 114 is in the logic "L" state. However, when the reference signal of the oscillator 104 of the module1 100 is less than the reference voltage Vref1, the output of the comparator 114 is in the logic "H" state. Further, upon the logic "H" state, the bias switch 202 of the module2 200 is turned on. Upon the logic "L" state, the bias switch 202 of the module2 200 is turned off. That is, in the event that the reference oscillator 104 of the module1 100 is operated, the bias switch 202 of the module2 200 is turned off. On the other hand, in the event that the reference oscillator 104 of the module1 100 is not operated (or, is out of order), the bias switch 202 of the module2 200 is turned on. Consequently, if the bias switch 202 of the module2 200 is switched on, the reference oscillator 204 of the module2 200 can be operated. Conclusively, if the reference oscillator 104 of the module1 100 is out of order, the reference oscillator 204 of the module2 200 is automatically switched to be operated.

Thus, as depicted in FIGS. 2 and 3, the level detectors 110 and 210, the DC amplifiers 112 and 212, and the comparators 114 and 214 are means for controlling switching-on/off of the bias switches 202 and 102 of the opposite module.

With reference to FIG. 3, the precedence determining circuit 103 is included within the bias switch 102. The precedence determining circuit 103 is constructed with R1, C18 and SW1. If a user switches on a switch SW1 of the module1 100, switches off the switch SW1 of the module2 200 and supplies the initial power supply VCC to the module1 100 and the module2 200, at the same time, the module2 200 is operated prior to the module1 100. In other words, a time delay required for turning on each transistor Q2 of the bias switch 102 in the first module1 100 of the power supply VCC can be generated due to a time constant of R1 and C18 of the precedence determining circuit 103 of the module1 100. But, since no time delay exists in the module2 200 where the power supply VCC is applied at the same time, the reference oscillator 204 of the module2 200 is driven prior to the module1 100. Accordingly, when the initial power supply is applied, the precedence determining circuit 103 determines which modules are firstly or selectively operated.

As apparent from the foregoing, the present invention has advantages of processing an outputting signal of either of the V-type and H-type reference oscillators, simultaneously synchronizing a phase locked dielectric resonator oscillator for use in the vertical polarization wave and the horizontal polarization wave, and automatically switched with the other reference oscillator to thereby be operated in the case that the one reference oscillator is out of order.

Therefore, it should be understood that the present invention not be limited to the particular embodiment disclosed as the best mode contemplated for carrying out the present invention, but that the present invention is not limited to the specific embodiments described in this specification except as defined in the appended claim.

What is claimed is:

1. A circuit for synchronizing the frequencies of two phase locked dielectric resonator oscillators of vertical and horizontal polarization waves in a digital microwave system for use in a co-channel, comprising:

first bias switching means for switching a first power supply to a first reference signal generating means;

second bias switching means for switching a second power supply to a second reference signal generating means;

said first reference signal generating means generating a first reference signal for synchronizing said oscillator frequencies;

said second reference signal generating means generating a second reference signal for synchronizing said oscillator frequencies;

first dividing means for firstly and secondly dividing and outputting power of said first reference signal;

second dividing means for firstly and secondly dividing and outputting power of said second reference signal;

first combining means for inputting the power of said firstly-divided first reference signal and said secondly-divided second reference signal and outputting the power to said phase locked dielectric resonator oscillator for said vertical polarization wave;

second combining means for inputting the power of said firstly-divided second reference signal and said secondly-divided first reference signal and outputting the power to said phase locked dielectric resonator oscillator for said horizontal polarization wave;

first switching control means for switching said second bias switching means in response to generation of said first reference signal secondly-divided in said first dividing means; and second switching control means for switching said first bias switching means in response to generation of said second reference signal secondly-divided in said second dividing means.

2. The circuit as recited in claim 1, wherein said first and second bias switching means, respectively, further comprise a precedence determining means having a delay component and a switch for operating one switching means prior to the other switching means when the power supply is initially applied.

3. The circuit as recited in claim 1, wherein said first switching control means comprises:

level detecting means for detecting the level of said first reference signal which is secondly divided in said first dividing means; and comparing means for comparing the level of said detected first reference signal with a predetermined reference voltage and controlling switching-on/off of said second bias switching means.

4. The circuit as recited in claim 3, wherein said comparing means controls switching-on of said second bias switching means when said level is lower than said reference voltage, and switching-off of said second switching means when said level is higher than said reference voltage.

5. The circuit as recited in claim 3, further comprising amplifying means which is positioned between said level detecting means and said comparing means for amplifying the level of said first reference signal.

6. The circuit as recited in claim 1, wherein said second switching control means is comprised of:

level detecting means for detecting the level of said second reference signal which is secondly divided in said second dividing means; and comparing means for comparing the level of said detected second reference signal with a predetermined reference voltage and controlling switching-on/off of said first bias switching means.

7. The circuit as recited in claim 6, wherein said comparing means controls switching-on of said first bias switching means when said level is lower than said reference voltage, and switching-off of said first switching means when said level is higher than said reference voltage.

8. The circuit as recited in claim 6, further comprising amplifying means which is positioned between said level detecting means and said comparing means and for amplifying the level of said second reference signal.

9. A circuit for synchronizing the frequencies of two phase locked dielectric resonator oscillators of vertical and horizontal polarization waves in a digital microwave system for use in a co-channel, comprising:

reference signal generating means for generating a reference signal for synchronizing said oscillator frequencies; and dividing means for firstly and secondly dividing the power of said reference signal in a substantially equal manner, applying said firstly-divided reference signal to said phase locked dielectric resonator oscillator for the vertical polarization wave, and applying said secondly-divided reference signal to said phase locked dielectric resonator oscillator for the horizontal polarization wave.

10. A circuit which includes first oscillator frequency synchronizing control means for controlling synchronism of a frequency of a phase locked dielectric resonator oscillator of a vertical polarization wave in a digital microwave system for use in a co-channel; and second oscillator frequency synchronizing control means for controlling synchronism of a frequency of a phase locked dielectric resonator oscillator of a horizontal polarization wave in said digital microwave system for use in said co-channel, wherein said first oscillator frequency synchronizing control means is comprised of:

first bias switching means for switching a first power supply to a first reference signal generating means in response to a given switching control signal of said second oscillator frequency synchronizing control means;

said first reference signal generating means generating a first reference signal for synchronizing the frequencies of both of said phase locked dielectric resonator oscillators;

first dividing means for firstly and secondly dividing and outputting the power of said first reference signal;

first combining means for inputting the power of said firstly-divided first reference signal and the power of a secondly-divided second reference signal provided in said second oscillator frequency synchronizing control means and outputting the power to said phase locked dielectric resonator oscillator for said vertical polarization wave; and first switching control means for detecting the level of said first reference signal secondly-divided in said first dividing means, comparing the detected level with a predetermined reference voltage, and outputting a switching control signal to a second bias switching means in said second oscillator frequency synchronizing control means, and wherein said second oscillator frequency synchronizing control means is comprised of:

said second bias switching means for switching a second power supply to a sencond reference signal generating means;

said second reference signal generating means generating said second reference signal for synchronizing the frequencies of both of said phase locked dielectric resonator oscillators;

second dividing means for firstly and secondly dividing and outputting the power of said second reference signal;

second combining means for inputting the power of said firstly-divided second reference signal and the power of said secondly-divided first reference signal and outputting the power to said phase locked dielectric resonator oscillator for said horizontal polarization wave; and second switching control means for detecting a level of said second reference signal secondly-divided in said second dividing means, comparing the detected level with a predetermined reference voltage, and outputting a switching control signal to said first bias switching means.

11. The circuit as recited in claim 10, wherein said first and second switching control means control switching-on of said first and second bias switching means when said level is lower than said reference voltage, and switching-off of said first and second switching means when said level is higher than said reference voltage.

* * * * *